(12) United States Patent
Bai et al.

(10) Patent No.: US 10,566,579 B2
(45) Date of Patent: Feb. 18, 2020

(54) OLED LIGHT-EMITTING DEVICE WITH SILVER NANOLAYER, AND PRODUCTION METHOD THEREOF

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Juanjuan Bai, Beijing (CN); Weilin Lai, Beijing (CN); Minghua Xuan, Beijing (CN); Liang Sun, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 117 days.

(21) Appl. No.: 15/321,576

(22) PCT Filed: Dec. 14, 2015

(86) PCT No.: PCT/CN2015/097272
§ 371 (c)(1),
(2) Date: Dec. 22, 2016

(87) PCT Pub. No.: WO2017/020475
PCT Pub. Date: Feb. 9, 2017

(65) Prior Publication Data
US 2018/0212201 A1  Jul. 26, 2018

(30) Foreign Application Priority Data
Aug. 4, 2015 (CN) .......................... 2015 1 0472870

(51) Int. Cl.
*H01L 51/52* (2006.01)
*H01L 51/56* (2006.01)
(Continued)

(52) U.S. Cl.
CPC ...... *H01L 51/5293* (2013.01); *H01L 27/3244* (2013.01); *H01L 51/5016* (2013.01);
(Continued)

(58) Field of Classification Search
CPC ............. H01L 51/5293; H01L 51/5268; H01L 51/5016; H01L 51/5265; H01L 51/56
(Continued)

(56) References Cited

U.S. PATENT DOCUMENTS

| 2001/0002703 | A1* | 6/2001 | Koyama | ............... | G09G 3/3275 257/40 |
| 2004/0086746 | A1* | 5/2004 | Lin | ....................... | C07D 311/16 428/690 |
| 2007/0222371 | A1* | 9/2007 | Raychaudhuri | ..... | H01L 51/5234 313/504 |

FOREIGN PATENT DOCUMENTS

| CN | 101132055 A | 2/2008 |
| CN | 102365767 A | 2/2012 |

(Continued)

OTHER PUBLICATIONS

Extended European Search Report, for European Patent Application No. 15891407.7, dated Mar. 5, 2018, 8 pages.
(Continued)

*Primary Examiner* — Robert T Huber
(74) *Attorney, Agent, or Firm* — Kinney & Lange, P.A.

(57) ABSTRACT

This disclosure provides an OLED light-emitting device, a production method thereof as well as a display apparatus, and relates to the technical field of OLED display, which can enhance the internal quantum efficiency of a blue OLED light-emitting device. This OLED light-emitting device comprises a substrate, and an anode, a hole transport layer, a blue light-emitting layer and a cathode provided on the substrate; the OLED light-emitting device further comprises an Ag nanolayer located between the anode and the hole
(Continued)

transport layer; wherein the blue light-emitting layer is a blue phosphorescent light-emitting layer; the absorption spectrum of the Ag nanolayer overlaps the emission spectrum of the blue phosphorescent light-emitting layer, and the blue phosphorescent light-emitting layer is located within the penetration depth of surface plasma of Ag nanoparticles in the Ag nanolayer. It is used in the production of a blue OLED light-emitting device and a display apparatus comprising the same.

17 Claims, 3 Drawing Sheets

(51) Int. Cl.
*H01L 27/32* (2006.01)
*H01L 51/50* (2006.01)
*H01L 51/00* (2006.01)

(52) U.S. Cl.
CPC ...... *H01L 51/5056* (2013.01); *H01L 51/5206* (2013.01); *H01L 51/5221* (2013.01); *H01L 51/5265* (2013.01); *H01L 51/5268* (2013.01); *H01L 51/5275* (2013.01); *H01L 51/56* (2013.01); *H01L 51/001* (2013.01); *H01L 2251/301* (2013.01); *H01L 2251/5369* (2013.01); *H01L 2251/558* (2013.01)

(58) Field of Classification Search
USPC .................. 257/40, 98, E51.018, E51.022
See application file for complete search history.

(56) References Cited

FOREIGN PATENT DOCUMENTS

| | | | |
|---|---|---|---|
| CN | 102820433 | A | 12/2012 |
| CN | 104600205 | A * | 5/2015 |
| CN | 104600205 | A | 5/2015 |
| CN | 104993065 | A | 10/2015 |
| JP | 2008243669 | A | 10/2008 |
| JP | 2010258197 | A | 11/2010 |

OTHER PUBLICATIONS

Zheng, Tianhang et al., "Nanoparticle-induced resonant tunneling behaviors in small molecule organic light-emitting devices," Applied Physics Letters of The University of Hong Kong, Mar. 25, 2009.
First Chinese Office Action, for Chinese Patent Application No. 2015104728703, dated Aug. 24, 2016, 16 pages.
International Search Report and Written Opinion (including English translation of Box V) for PCT Patent Application No. PCT/CN2015/097272, dated Dec. 14, 2015.
Chinese Rejection Decision, for Chinese Patent Application No. 201510472870.3, dated Mar. 15, 2017, 19 pages.

* cited by examiner

OLED LIGHT-EMITTING DEVICE WITH SILVER NANOLAYER, AND PRODUCTION METHOD THEREOF

FIELD OF THE INVENTION

This disclosure relates to the technical field of OLED display, and particularly to an OLED light-emitting device and a production method thereof as well as a display apparatus.

BACKGROUND OF THE INVENTION

An organic light-emitting diode (simply referred to as OLED) has advantages of low energy consumption, high efficiency, spontaneous light emission, high response speed, or the like.

A fluorescent or phosphorescent material is typically used as the luminescent material therein. Since the phosphorescent material still maintains a brightness for a considerable long period after excitation stops, the internal quantum efficiency thereof is higher than that of a known fluorescent material, OLEDs which mainly use the mechanism of phosphorescent light emission are highly anticipated recently.

However, options of phosphorescent materials suitable for emitting blue light are relatively few at present, resulting in that the enhancement of the internal quantum efficiency thereof is restricted from the aspect of materials.

SUMMARY OF THE INVENTION

This disclosure provides an OLED light-emitting device and a production method thereof as well as a display apparatus, which can enhance the internal quantum efficiency of a blue OLED light-emitting device.

To achieve the object described above, the disclosure employs the following technical solutions.

In one aspect, there is provided an OLED light-emitting device, comprising a substrate, and an anode, a hole transport layer, a blue light-emitting layer and a cathode provided on the substrate; the OLED light-emitting device further comprises an Ag nanolayer located between the anode and the hole transport layer; wherein the blue light-emitting layer is a blue phosphorescent light-emitting layer; the absorption spectrum of the Ag nanolayer overlaps the emission spectrum of the blue phosphorescent light-emitting layer, and the blue phosphorescent light-emitting layer is located within the penetration depth of surface plasma of Ag nanoparticles in the Ag nanolayer.

Preferably, the anode is opaque, and the cathode is semi-transparent.

Further preferably, the OLED light-emitting device further comprises a covering layer located on a side of the cathode away from the substrate, wherein the covering layer has a refractive index between 1.8 and 2.0.

Preferably, the Ag nanoparticles have a diameter between 15 and 30 nm.

Preferably, the Ag nanolayer has a thickness between 15 and 60 nm.

Preferably, the hole transport layer has a thickness between 1100 and 1300 nm.

Preferably, the blue phosphorescent light-emitting layer has a thickness between 20 and 40 nm.

Preferably, the OLED light-emitting device further comprises an electron transport layer located between the cathode and the blue phosphorescent light-emitting layer.

Based on those described above, the OLED light-emitting device further comprises a hole injection layer located between the anode and the hole transport layer; the Ag nanolayer is located between the hole injection layer and the hole transport layer, or the Ag nanolayer is located between the anode and the hole injection layer.

In another aspect, there is provided a display apparatus, comprising the OLED light-emitting device described above.

Preferably, the display apparatus further comprises a thin film transistor electrically connected to the anode of the OLED light-emitting device.

In yet another aspect, there is provided a production method for an OLED light-emitting device, comprising forming an anode, a hole transport layer, a blue light-emitting layer, and a cathode on a substrate; the method further comprises forming an Ag nanolayer between the anode and the hole transport layer; wherein the blue light-emitting layer is a blue phosphorescent light-emitting layer; the absorption spectrum of the Ag nanolayer overlaps the emission spectrum of the blue phosphorescent light-emitting layer, and the blue phosphorescent light-emitting layer is located within the penetration depth of surface plasma of Ag nanoparticles in the Ag nanolayer.

Preferably, Ag nanoparticles having a diameter of 15-30 nm are synthesized by a Liquid-Solid-Solution chemical synthesis method; the Ag nanolayer is formed by spin-coating an organic solvent comprising the Ag nanoparticles.

Preferably, the hole transport layer having a thickness between 1100 and 1300 nm is formed by an evaporation method.

Based on those described above, preferably, the anode is opaque, and the cathode is semi-transparent.

An embodiment of the disclosure provides an OLED light-emitting device. By forming an Ag nanolayer between the anode and the hole transport layer, enabling the absorption spectrum of the Ag nanolayer to overlap the emission spectrum of the blue phosphorescent light-emitting layer, and locating the blue phosphorescent light-emitting layer within the penetration depth of surface plasma of Ag nanoparticles, resonance between surface plasmas of Ag nanoparticles and excitons formed by recombination in the blue phosphorescent light-emitting layer is allowed to occur. The energy formed after resonance may be transferred to the excitons to perform radioluminescence so as to enhance the speed of spontaneous radiation of triplet excitons and reduce the quenching of triplet-triplet excitons at a high current density, and thus the internal quantum efficiency of the device is increased and the utilization rate of excitons may be increased.

BRIEF DESCRIPTION OF THE DRAWINGS

In order to illustrate the technical solutions in embodiments of the disclosure or in the prior art more clearly, figures required for describing the embodiments or the prior art will be simply introduced below. It is apparent that the figures described below are merely some embodiments of the disclosure, and other figures may be further obtained by those of ordinary skill in the art according to these figures without exerting inventive work.

REFERENCE NUMERALS

Figure 1:
FIG. 1 is a first structural schematic diagram of an OLED light-emitting device provided in an embodiment of the disclosure.

01—OLED light-emitting device; 10—substrate; 20—anode; 30—Ag nanolayer; 40—hole transport layer; 50—blue phosphorescent light-emitting layer; 60—cathode; 70—light-reflecting layer; 80—covering layer; 90—electron transport layer; 100—hole injection layer; 110—thin film transistor.

DETAILED DESCRIPTION OF THE INVENTION

The technical solutions in the embodiments of the disclosure will be described clearly and fully below in conjunction with accompanying drawings in embodiments of the disclosure. Obviously, the embodiments described are merely part of the embodiments of the disclosure, rather than all of the embodiments. Based on the embodiments in the disclosure, all other embodiments obtained by those of ordinary skill in the art without performing inventive work belong to the scope protected by the disclosure.

An embodiment of the disclosure provides an OLED light-emitting device 01. As shown in FIGS. 1-5, this OLED light-emitting device 01 comprises a substrate 10, and an anode 20, a hole transport layer 40, a blue light-emitting layer, and a cathode 60 provided on the substrate 10, and further comprises an Ag nanolayer 30 located between the anode 20 and the hole transport layer 40.

Here, the blue light-emitting layer is a blue phosphorescent light-emitting layer 50; and the absorption spectrum of the Ag nanolayer 30 overlaps the emission spectrum of the blue phosphorescent light-emitting layer 50, and the blue phosphorescent light-emitting layer 50 is located within the penetration depth of surface plasma of Ag nanoparticles in the Ag nanolayer 30.

Those to be indicated are as follows. First, since the emission spectrum of the Ag nanolayer 30 may be adjusted by the size of the Ag nanoparticles in the Ag nanolayer 30, the emission spectrum of the Ag nanolayer 30 may be allowed to overlap the emission spectrum of the blue phosphorescent light-emitting layer 50 by adjusting the size of the Ag nanoparticles in the embodiment of the disclosure.

Here, when phosphorescent materials in the blue phosphorescent light-emitting layer 50 are different, there is a certain difference in the emission spectra thereof. Therefore, the size of the Ag nanoparticles is not defined in the embodiment of the disclosure, and the size of the Ag nanoparticles may be correspondingly selected according to the phosphorescent material selected.

Second, the surface plasma is a local surface electromagnetic wave, and has an intensity exhibiting an exponential decay along with the distance vertical to the surface. That is, the surface plasma has a certain effective penetration depth, which is the range of action of surface plasma.

Here, in the penetration depth $$Z = \frac{\lambda}{2\pi}\left[\frac{(\varepsilon_0 - \varepsilon_m)}{\varepsilon_m^2}\right]^{\frac{1}{2}},$$

$\varepsilon_0$ is the dielectric constant of an organic material (i.e., the hole transport layer 40 and a part of the blue phosphorescent light-emitting layer 50) contained within the distance between metal surface plasmas and light-emitting excitons (excitons are generated by recombination of holes and electrons in the blue phosphorescent light-emitting layer 50), $\varepsilon_m$ is the dielectric constant of the Ag nanoparticle, and $\lambda$ is a photoluminescence (simply referred to as PL) spectrum which surface plasma corresponds to, and the unit thereof is nm.

That is, it can be seen from the equation of the penetration depth described above that the value of the penetration depth Z is determined after the materials of the hole transport layer 40 and the blue phosphorescent light-emitting layer 50 are determined.

On this basis, by adjusting the thickness of the hole transport layer 40, the blue phosphorescent light-emitting layer 50 is allowed to be located within the penetration depth of surface plasma of the Ag nanoparticles. That is, excitons are limited within the penetration depth of surface plasma of the Ag nanoparticles.

Third, the materials of the hole transport layer 40 and the blue phosphorescent light-emitting layer 50 are not defined.

Fourth, the materials of the anode 20 and the cathode 60 are not defined. Here, the cathode 60 may be allowed to be thinner. That is, the cathode 60 is semi-transparent. Of course, the cathode 60 may also be allowed to be relatively thick. That is, the cathode 60 is opaque. Those may be specifically set according to practical situations, and are not defined herein.

An embodiment of the disclosure provides an OLED light-emitting device 01. By forming an Ag nanolayer between the anode 20 and the hole transport layer 40, enabling the absorption spectrum of the Ag nanolayer 30 to overlap the emission spectrum of the blue phosphorescent light-emitting layer 50, and locating the blue phosphorescent light-emitting layer 50 within the penetration depth of surface plasma of the Ag nanoparticles, resonance between surface plasmas of Ag nanoparticles and excitons formed by recombination on the blue phosphorescent light-emitting layer 50 is allowed to occur. The energy formed after resonance may be transferred to excitons to perform radioluminescence so as to enhance the speed of spontaneous radiation of triplet excitons and reduce the quenching of triplet-triplet excitons at a high current density, and thus the internal quantum efficiency of the device is increased and the utilization rate of excitons may be increased.

Preferably, the anode 20 is opaque. That is, a three-layer structure of transparent conductive layer/opaque metal layer/transparent conductive layer, for example a three-layer structure of ITO conductive layer/Ag conductive layer/ITO conductive layer, may be used as the anode 20. The cathode 60 is semi-transparent. That is, the cathode 60 employs a metal material and has a relatively thin thickness.

Figure 3:
FIG. 3 is a third structural schematic diagram of an OLED light-emitting device provided in an embodiment of the disclosure.

Of course, as shown in FIG. 3, the anode 20 may also be transparent. That is, an ITO material is used. On this basis, the OLED light-emitting device 01 may further comprise a light-reflecting layer 70 on a side of the anode 20 away from the cathode 60; wherein, with respect to the cathode 60, the anode 20 is provided close to the substrate 10.

That is, from bottom to top, there are sequentially: a substrate 10, a light-reflecting layer 70, a transparent anode 20, an Ag nanolayer 30, a hole transport layer 40, a blue phosphorescent light-emitting layer 50, and a semi-transparent cathode 60.

Here, the material of the cathode 60 may be, for example a magnesium silver alloy, and the thickness thereof may be less than 15 nm.

In the embodiment of the disclosure, illustration is made by exemplifying the anode 20 which is opaque (i.e., comprising a three-layer structure of transparent conductive layer/opaque metal layer/transparent conductive layer). By allowing the anode 20 to be opaque and allowing the cathode 60 to be semi-transparent, a microcavity may be formed between the anode 20 to the cathode 60. Due to the interference effect (microcavity effect) of the light in the microcavity, the output efficiency of the light may be increased.

Figure 4:
FIG. 4 is a fourth structural schematic diagram of an OLED light-emitting device provided in an embodiment of the disclosure.

Further preferably, as shown in FIG. 4, the OLED light-emitting device 01 further comprises a covering layer 80 located on a side of the cathode 60 away from the substrate 10, and the covering layer 80 has a refractive index between 1.8 and 2.0.

Here, the thickness of the covering layer 80 is preferably between 50 and 55 nm.

Since the refractive index of the covering layer 80 is relatively larger, significant shifts of the intensity and the color coordinate of the light will occur along with the variation of the viewing angle, and the distribution of light intensity substantially complies with Lambertian distribution. That is, the brightness on the vertical angle is much greater than brightnesses on other angles, and thus the output efficiency of the light on the vertical angle may be increased.

Preferably, the Ag nanoparticles have a diameter between 15 and 30 nm, and for example, may be 25 nm.

Preferably, the Ag nanolayer has a thickness between 15 and 60 nm, preferably between 15 and 30 nm.

Here, by setting the diameter of the Ag nanoparticles between 15 and 30 nm, the absorption spectrum thereof may be allowed to be at least partly located in the range of the light emission spectrum of the blue phosphorescent light-emitting layer 50.

Preferably, the hole transport layer 40 has a thickness between 1100 and 1300 nm.

Here, the material of the hole transport layer 40 may be aromatic triamine series, biphenyl diamine derivatives, and cross structure linked diamine biphenyl. For example, it may be NPB (N,N'-diphenyl-N,N'-(1-naphthyl)-1,1'-biphenyl-4,4'-diamine), TCTA (4,4',4''-Tri(9-carbazoyl)triphenylamine), m-MTDATA (4,4',4''-Tris (N-3-methylphenyl-N-phenylamino)triphenylamine), or the like.

In the embodiment of the disclosure, the thickness of the hole transport layer 40 is set in the range of 1100-1300 nm. On the one hand, surface plasmas of Ag nanoparticles and excitons are separated, and the metallic light absorption due to Forster-type transfer is reduced. On the other hand, projections of the Ag nanolayer 30 are completely covered to prevent the phenomenon of breakdown and excitons can be limited within the penetration depth of surface plasma of the Ag nanoparticles, allowing that effective resonance phenomenon can occur between excitons and plasmas.

It is to be indicated that when the OLED light-emitting device 01 comprises the microcavity structure described above, the thickness of the hole transport layer 40 may be adjusted according to the thickness of the microcavity.

Preferably, the blue phosphorescent light-emitting layer 50 has a thickness between 20 and 40 nm.

Further, in order to obtain a higher internal quantum efficiency, the blue phosphorescent light-emitting layer 50 preferably employs a host-guest doping system; wherein an iridium (Ir) complex, for example Flrpic, may be used as a guest material, and CBP (4,4'-Bis(9H-carbazol-9-yl)biphenyl), UGH3 (1,3-bis(triphenylsilicon)benzene), UGH4, mCP (9,9'-(1,3-phenyl)di-9H-carbazole) or the like, may be used as a host material.

In the embodiment of the disclosure, by setting the thickness of the blue phosphorescent light-emitting layer 50 in the range of 20-40 nm, it is possible to prevent the light-emitting interface from shifting to an adjacent organic layer.

Figure 2:
FIG. 2 is a second structural schematic diagram of an OLED light-emitting device provided in an embodiment of the disclosure.

Preferably, as shown in FIGS. 2-4, the OLED light-emitting device 01 further comprises an electron transport layer 90 located between the cathode 60 and the blue phosphorescent light-emitting layer 50.

Here, the material of the electron transport layer 90 may be metal chelates, azole compounds, phenanthroline derivatives, etc. For example, it may be AlQ3 (tris(8-hydroxyquinolinato)aluminum), BPhen (4,7-diphenyl-1,10-phenanthroline), TmPyPB (1,3,5-tris [(3-pyridyl)-3-phenyl]benzene), OXD-7 (2,2'-(1,3-phenyl)bis [5-(4-tert-butylphenyl)-1,3,4-oxadiazole]). The thickness may be 25-35 nm, for example 30 nm.

Compared to one that is not provided with the electron transport layer 90, it required to enable the blue phosphorescent light-emitting layer 50 to have a relatively strong ability of electron transport. By providing the electron transport layer 90, the electron transporting ability may be enhanced, and the requirement for electron transporting ability with respect to the blue phosphorescent light-emitting layer 50 may be reduced.

Based on those described above, preferably, the OLED light-emitting device 01 further comprises a hole injection layer 100 located between the anode 20 and the hole transport layer 40.

Figure 5:
FIG. 5 is a fifth structural schematic diagram of an OLED light-emitting device provided in an embodiment of the disclosure.

Here, as shown in FIG. 5, the Ag nanolayer 30 is located between the hole injection layer 100 and the hole transport layer 40.

Or, the Ag nanolayer 30 may be located between the anode 20 and the hole injection layer 100.

By providing the hole injection layer 100, on the one hand, the hole transporting ability may be enhanced, and on the other hand, it may also have a function of repairing surface defects of the anode 20 when it is located above the anode 20 as shown in FIG. 5.

It is to be indicated that since a microcavity is formed between the anode 20 and the cathode 60 and the thickness of the microcavity is determined, the hole injection layer 100 may have a function of adjusting the thickness of the hole transport layer 40, i.e., a function of adjusting the distance between the plasmas and that excitons, after it is added.

Moreover, with respect to the circumstances as shown in FIG. 5, since the Ag nanolayer 30 is formed on the hole injection layer 100, an organic solvent which does not corrode the hole injection layer 100 is required to be used when forming the Ag nanolayer 30. Here, an aqueous dispersion of poly(3,4-ethylenedioxythiophene) and poly(styrene sulfonates) (PEDOT:PSS) is preferably used as the material for the hole injection layer 100.

An embodiment of the disclosure further provides a display apparatus, comprising any one of OLED light-emitting devices 01 described above.

By forming an Ag nanolayer 30 between the anode 20 and the hole transport layer 40, enabling the absorption spectrum of the Ag nanolayer 30 to overlap the emission spectrum of the blue phosphorescent light-emitting layer 50, and locating the blue phosphorescent light-emitting layer 50 within the penetration depth of surface plasma of the Ag nanoparticles, resonance between the surface plasmas of Ag nanoparticles and the excitons formed by recombination on the blue phosphorescent light-emitting layer 50 is allowed to occur. The energy generated after resonance may be transferred to excitons to perform radioluminescence so as to enhance the speed of spontaneous radiation of triplet excitons and reduce the quenching of triplet-triplet excitons at a high current density, and thus the internal quantum efficiency of the device is increased and the utilization rate of excitons may be increased.

Figure 6:
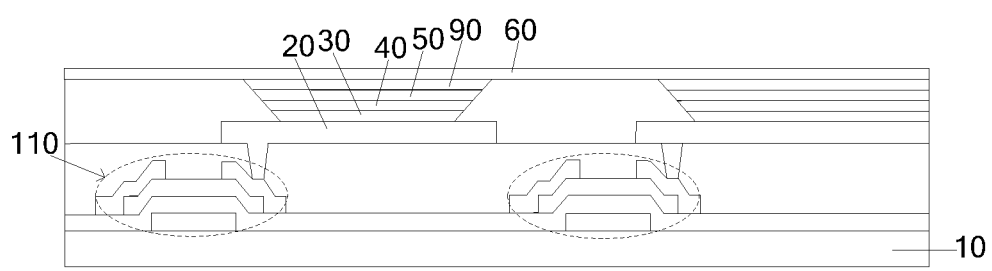
FIG. 6 is a structural schematic diagram of a display apparatus provided in an embodiment of the disclosure.

In view of the deficient aspect of a passive matrix when being used in a large-size display apparatus, it is preferable that the display apparatus provided in an embodiment of the disclosure is an active matrix type display apparatus. That is, as shown in FIG. 6, the display apparatus further comprises a thin film transistor 110 electrically connected to an anode 20 of the OLED light-emitting device 01.

Here, the thin film transistor 110 comprises a gate electrode, a gate insulating layer, a semiconductor active layer, a source electrode, and a drain electrode.

It is to be indicated that the structure of the thin film transistor 110 is not defined in the embodiment of the disclosure, and it may be top gate type or may be bottom gate type. Moreover, the material of the semiconductor active layer is not defined either, and it may employ semiconductor materials, such as amorphous silicon, polycrystalline silicon, metal oxides, organic materials or the like.

Of course, the OLED display apparatus should further comprise a package substrate overlying on the cathode 60 or the covering layer 80. The package substrate may be a thin film or may be a glass cover plate, and it is not specifically defined herein.

An embodiment of the disclosure further provides a production method for an OLED light-emitting device, and with reference to those shown in FIG. 1, this production method comprises: forming an anode 20, a hole transport layer 40, a blue light-emitting layer, and a cathode 60 on a substrate 10; and the method further comprises: forming an Ag nanolayer 30 between the anode 20 and the hole transport layer 40. Here, the blue light-emitting layer is a blue phosphorescent light-emitting layer 50; and the absorption spectrum of the Ag nanolayer 30 overlaps the emission spectrum of the blue phosphorescent light-emitting layer 50, and the blue phosphorescent light-emitting layer 50 is located within the penetration depth of surface plasma of the Ag nanoparticles in the Ag nanolayer 30.

Here, spin-coating an organic solvent containing the Ag nanoparticle may be used to form an Ag nanolayer 30, or thermal evaporation may be used to evaporate a metal thin layer and then annealing treatment is performed to agglomerate the metal thin film into nanoparticles so as to form an Ag nanolayer 30, and it is not specifically defined herein.

Preferably, the anode 20 is opaque and the cathode 60 is semi-transparent.

Here, a three-layer structure of ITO conductive layer/Ag conductive layer/ITO conductive layer may be used as the anode 20. The material of the cathode 60 may be, for example a magnesium silver alloy, and the thickness thereof may be less than 15 nm.

Further preferably, with reference to those shown in FIG. 4, the method further comprises forming a covering layer 80 on a side of the cathode 60 away from the substrate 10, and the covering layer 80 has a refractive index between 1.8 and 2.0. Here, the thickness of the covering layer 80 is preferably between 50 and 55 nm.

Preferably, Ag nanoparticles having a diameter of 15-30 nm may be synthesized by a Liquid-Solid-Solution (simply referred to as LSS) chemical synthesis method. Thus, the absorption spectrum thereof may be allowed to be at least partly located in the range of the light emission spectrum of the blue phosphorescent light-emitting layer 50.

On this basis, the Ag nanolayer 30 may be formed by spin-coating an organic solvent containing Ag nanoparticles.

Preferably, the hole transport layer 40 having a thickness between 1100 and 1300 nm is formed by an evaporation method.

Here, the material of the hole transport layer 40 may be aromatic triamine series, biphenyl diamine derivatives, cross structure linked diamine biphenyl, or the like.

In the embodiment of the disclosure, the hole transport layer 40 having a thickness of 1100-1300 nm is formed. On the one hand, the surface plasmas of Ag nanoparticles and excitons are separated, and the metallic light absorption due to Forster-type transfer is reduced. On the other hand, the projections of the Ag nanolayer 30 are completely covered to prevent the phenomenon of breakdown and excitons can be limited within the penetration depth of surface plasma of the Ag nanoparticle, allowing that effective resonance phenomenon can occur between excitons and plasmas.

Preferably, the blue phosphorescent light-emitting layer 50 having a thickness between 20 and 40 nm is formed by an evaporation method. In order to obtain a higher internal quantum efficiency, the blue phosphorescent light-emitting layer 50 preferably employs a host-guest doping system; wherein an iridium (Jr) complex, for example Flrpic, may be used as a guest material, and CBP, UGH3, UGH4, mCP or the like, may be used as a host material.

Preferably, as shown in FIGS. 2-5, the method further comprises forming an electron transport layer 90 having a thickness between 25 and 35 nm by an evaporation method. Here, the material of the electron transport layer 90 may be metal chelates, azole compounds, phenanthroline derivatives, or the like.

Based on those described above, preferably, with reference to those shown in FIG. 5, the method further comprises forming a hole injection layer 100 between the anode 20 and the Ag nanolayer 30 by an evaporation method. Here, an aqueous dispersion of poly(3,4-ethylenedioxythiophene) and poly(styrene sulfonates) (PEDOT:PSS) is preferably used as the material for the hole injection layer 100.

Moreover, the hole injection layer 100 may also be formed between the Ag nanolayer 30 and the hole transport layer 40.

Figure 7:
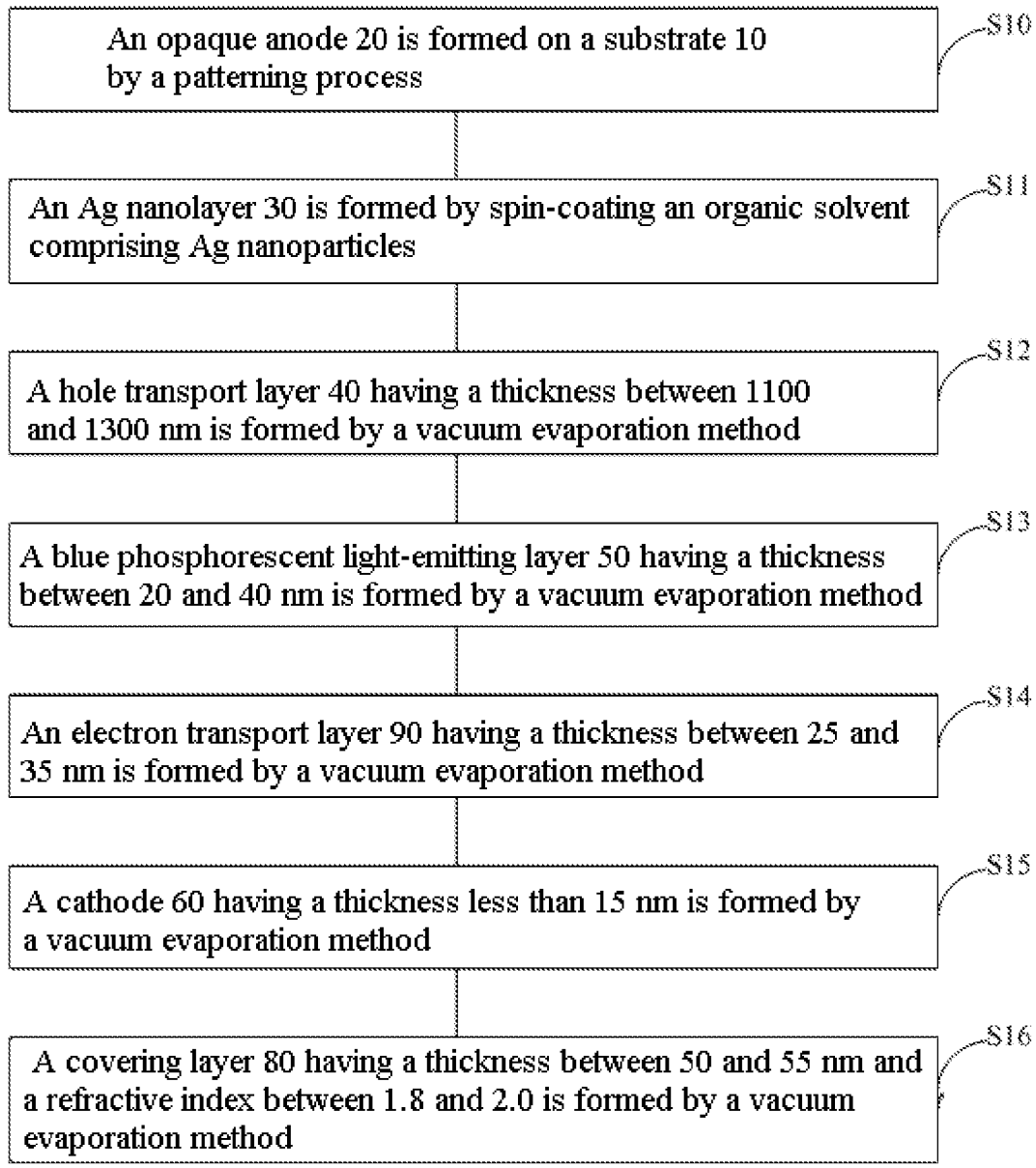
FIG. 7 is a schematic flow chart of a production method for an OLED light-emitting device provided in an embodiment of the disclosure.

A specific example is provided below to describe a production method for an OLED light-emitting device 01 in detail. As shown in FIG. 7, this method comprises the following steps.

S10: With reference to those shown in FIG. 4, an opaque anode 20 is formed on a substrate 10 by a patterning process.

For example, a three-layer structure of ITO conductive layer/Ag conductive layer/ITO conductive layer is used as the anode 20.

S11: With reference to those shown in FIG. 4, on the basis of S10, an Ag nanolayer 30 is formed by spin-coating an organic solvent comprising Ag nanoparticles.

Here, an Ag nanoparticle having a diameter of 15-30 nm may be synthesized by using a Liquid-Solid-Solution chemical synthesis method.

S12: With reference to those shown in FIG. 4, on the basis of S11, a hole transport layer 40 having a thickness between 1100 and 1300 nm is formed by a vacuum evaporation method.

Here, the material of the hole transport layer 40 may be NPB, TCTA, m-MTDATA, etc.

S13: With reference to those shown in FIG. 4, on the basis of S12, a blue phosphorescent light-emitting layer 50 having a thickness between 20 and 40 nm is formed by a vacuum evaporation method.

Here, in the blue phosphorescent light-emitting layer 50, FIrpi may be used as a guest material, and CBP, UGH3, UGH4, mCP, etc., may be used as a host material.

S14: With reference to those shown in FIG. 4, on the basis of S13, an electron transport layer 90 having a thickness between 25 and 35 nm is formed by a vacuum evaporation method.

Here, the material of the electron transport layer 90 may be AlQ3, BPhen, TmPyPB, OXD-7, or the like.

S15: With reference to those shown in FIG. 4, on the basis of S14, a cathode 60 having a thickness less than 15 nm is formed by a vacuum evaporation method.

Here, the material of the cathode 60 may be a magnesium silver alloy.

S16: With reference to those shown in FIG. 4, on the basis of S15, a covering layer 80 having a thickness between 50 and 55 nm and a refractive index between 1.8 and 2.0 is formed by a vacuum evaporation method.

Those described above are only specific embodiments of the disclosure, but the scope of the disclosure is not limited thereto. Within the technical scope disclosed by this present disclosure, any person skilled in the art will easily conceive variations or replacements, which should be covered by the scope of the disclosure. Therefore, the protection scope of the disclosure should be determined by the scope of the claims.

What is claimed is:

1. An OLED light-emitting device, comprising a substrate, and an anode, a hole transport layer, a blue light-emitting layer and a cathode provided on the substrate; wherein:
   the OLED light-emitting device further comprises an Ag nanolayer located between the anode and the hole transport layer and the Ag nanolayer directly contacts the anode;
   the blue light-emitting layer is a blue phosphorescent light-emitting layer;
   the absorption spectrum of the Ag nanolayer overlaps the emission spectrum of the blue phosphorescent light-emitting layer, and the blue phosphorescent light-emitting layer is located within the penetration depth of surface plasma of Ag nanoparticles in the Ag nanolayer, and
   the hole transport layer has a thickness between 1100 and 1300 nm, and the Ag nanoparticles have a diameter between 15 and 30 nm.

2. The OLED light-emitting device according to claim 1, wherein:
   the anode is opaque, and the cathode is semi-transparent.

3. The OLED light-emitting device according to claim 2, wherein:
   the OLED light-emitting device further comprises a covering layer located on a side of the cathode away from the substrate, wherein the covering layer has a refractive index between 1.8 and 2.0.

4. The OLED light-emitting device according to claim 1, wherein:
   the Ag nanolayer has a thickness between 15 and 60 nm.

5. The OLED light-emitting device according to claim 1, wherein:
   the blue phosphorescent light-emitting layer has a thickness between 20 and 40 nm.

6. The OLED light-emitting device according to claim 1, wherein:
   the OLED light-emitting device further comprises an electron transport layer located between the cathode and the blue phosphorescent light-emitting layer.

7. The OLED light-emitting device according to claim 1, wherein:
   the OLED light-emitting device further comprises a hole injection layer located between the anode and the hole transport layer; and
   the Ag nanolayer is located between the hole injection layer and the hole transport layer, or the Ag nanolayer is located between the anode and the hole injection layer.

8. A display apparatus comprising the OLED light-emitting device of claim 1.

9. The display apparatus according to claim 8, wherein the display apparatus further comprises a thin film transistor electrically connected to the anode of the OLED light-emitting device.

10. A production method for an OLED light-emitting device, comprising forming an anode, a hole transport layer, a blue light-emitting layer, and a cathode on a substrate; and forming an Ag nanolayer between the anode and the hole transport layer, wherein the Ag nanolayer directly contacts the anode; wherein:
    the blue light-emitting layer is a blue phosphorescent light-emitting layer;
    the absorption spectrum of the Ag nanolayer overlaps the emission spectrum of the blue phosphorescent light-emitting layer, and the blue phosphorescent light-emitting layer is located within the penetration depth of surface plasma of Ag nanoparticles in the Ag nanolayer;
    the hole transport layer, which has a thickness between 1100 and 1300 nm, is formed by an evaporation method; and
    the Ag nanoparticles have a diameter between 15 and 30 nm.

11. The method according to claim 10, wherein:
    the Ag nanoparticles having a diameter of 15-30 nm are synthesized by a Liquid-Solid-Solution chemical synthesis method; and
    the Ag nanolayer is formed by spin-coating an organic solvent comprising the Ag nanoparticles.

12. The method according to claim 10, wherein:
    the Ag nanolayer has a thickness between 15 and 60 nm.

13. The method according to claim 10, wherein:
    the anode is opaque, and the cathode is semi-transparent.

14. The display apparatus according to claim 8, wherein the anode is opaque, and the cathode is semi-transparent.

15. The display apparatus according to claim 8, wherein the OLED light-emitting device further comprises a covering layer located on a side of the cathode away from the substrate, wherein the covering layer has a refractive index between 1.8 and 2.0.

16. The display apparatus according to claim 8, wherein the OLED light-emitting device further comprises an electron transport layer located between the cathode and the blue phosphorescent light-emitting layer.

17. The display apparatus according to claim 8, wherein:
the OLED light-emitting device further comprises a hole injection layer located between the anode and the hole transport layer; and
the Ag nanolayer is located between the hole injection layer and the hole transport layer, or the Ag nanolayer is located between the anode and the hole injection layer.

* * * * *

UNITED STATES PATENT AND TRADEMARK OFFICE
CERTIFICATE OF CORRECTION

PATENT NO. : 10,566,579 B2
APPLICATION NO. : 15/321576
DATED : February 18, 2020
INVENTOR(S) : Juanjuan Bai et al.

Page 1 of 1

It is certified that error appears in the above-identified patent and that said Letters Patent is hereby corrected as shown below:

In the Specification

Column 8, Line 34:
Delete "Jr"
Insert --Ir--

Signed and Sealed this
Twenty-third Day of June, 2020

Andrei Iancu
*Director of the United States Patent and Trademark Office*